United States Patent [19]

Mori

[11] Patent Number: 4,799,004
[45] Date of Patent: Jan. 17, 1989

[54] TRANSFER CIRCUIT FOR OPERATION TEST OF LSI SYSTEMS

[75] Inventor: Shojiro Mori, Kawasaki, Japan

[73] Assignee: Kabushiki Kaisha Toshiba, Kawasaki, Japan

[21] Appl. No.: 148,385

[22] Filed: Jan. 25, 1988

[30] Foreign Application Priority Data

Jan. 26, 1987 [JP] Japan ................... 62-15816

[51] Int. Cl.$^4$ ............................... G01R 15/12
[52] U.S. Cl. ......................... 324/73 R; 371/25
[58] Field of Search .............. 377/78, 81; 371/21, 371/25, 27; 307/247 R, 584; 324/73 R, 73 AT

[56] References Cited

U.S. PATENT DOCUMENTS

| | | | |
|---|---|---|---|
| 4,587,480 | 5/1986 | Fasio | 324/73 R |
| 4,594,711 | 6/1986 | Thatte | 324/73 R |
| 4,630,270 | 12/1986 | Petit | 371/25 |
| 4,635,261 | 1/1987 | Anderson | 324/73 R |
| 4,680,539 | 7/1987 | Tsai | 324/73 R |
| 4,682,329 | 7/1987 | Kluth | 371/25 |
| 4,688,222 | 8/1987 | Blum | 371/25 |
| 4,698,588 | 10/1987 | Hwang et al. | 324/73 R |
| 4,698,830 | 10/1987 | Berzilai | 377/81 |
| 4,710,933 | 12/1987 | Powell | 371/25 |
| 4,713,605 | 12/1987 | Iyer et al. | 324/73 R |

OTHER PUBLICATIONS

Williams et al., "Design for Testability—A Survey," Proceedings of the IEEE, vol. 71, No. 1, pp. 103–107, Jan. 1983.

Primary Examiner—Michael J. Tokar
Attorney, Agent, or Firm—Finnegan, Henderson, Farabow, Garrett & Dunner

[57] ABSTRACT

A transfer circuit for the operation test of an LSI system inlcudes a mode setting section for selectively setting a first or second operation mode, a plurality of first shift register circuits connected to the input terminals of function blocks of the LSI system to respectively latch input data to the function blocks in a parallel fashion in the first operation mode and shift the input data in the second operation mode, a plurality of second shift register circuits connected to the output terminals of the function blocks of the LSI system to respectively latch output data of the function blocks in a parallel fashion in the first operation mode and shift the output data in the second operation mode, and a serial transfer line for serially connecting the first and second shift register circuits.

9 Claims, 5 Drawing Sheets

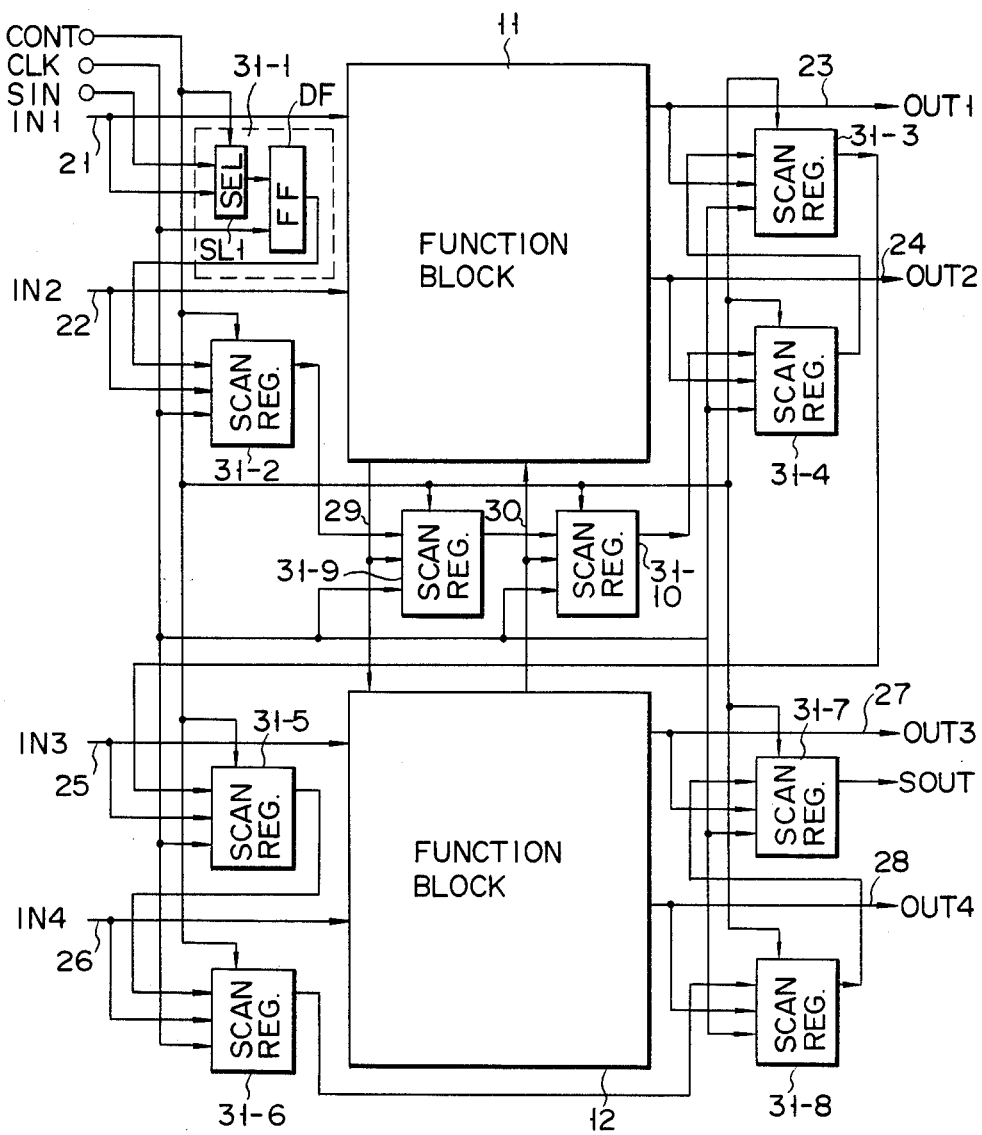
F I G. 2

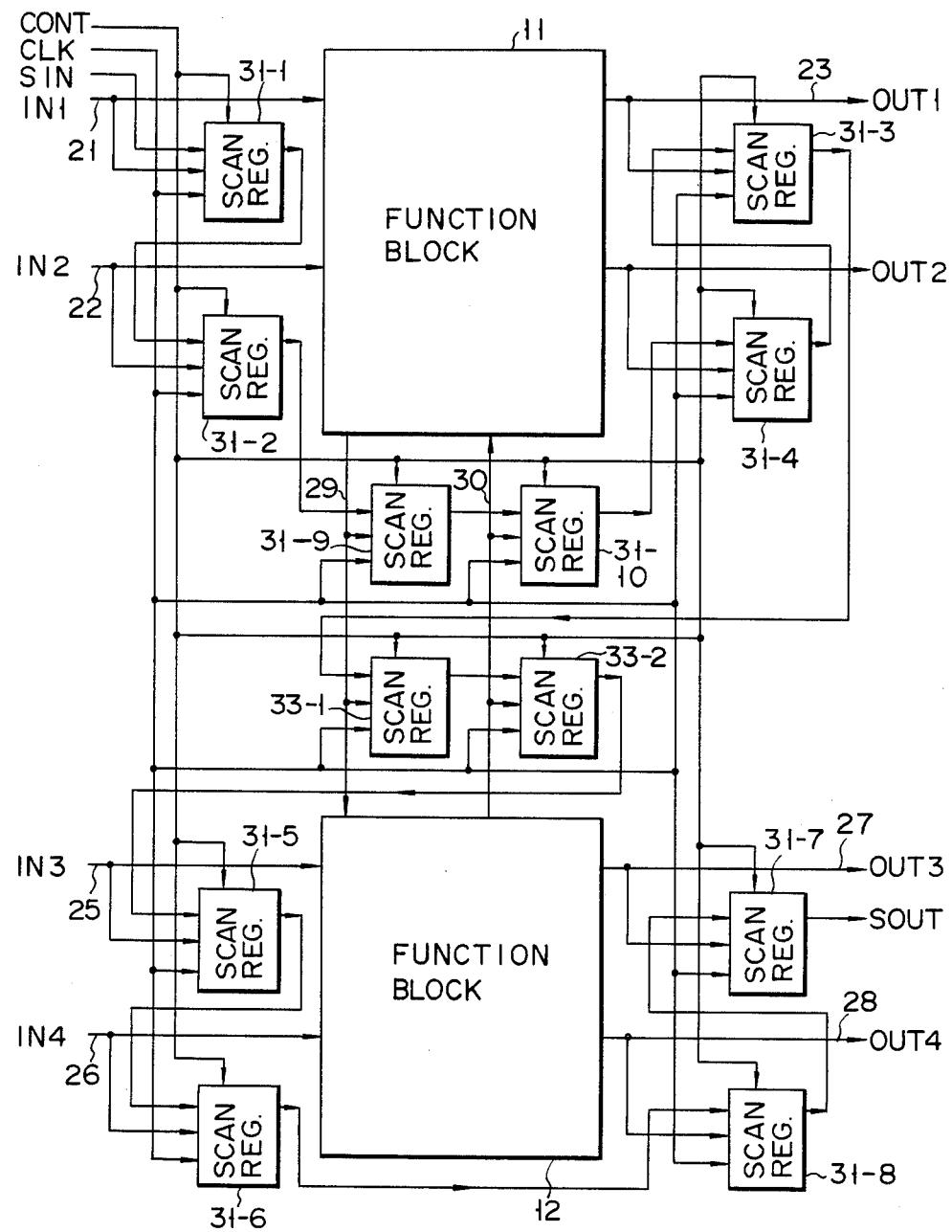
F I G. 5

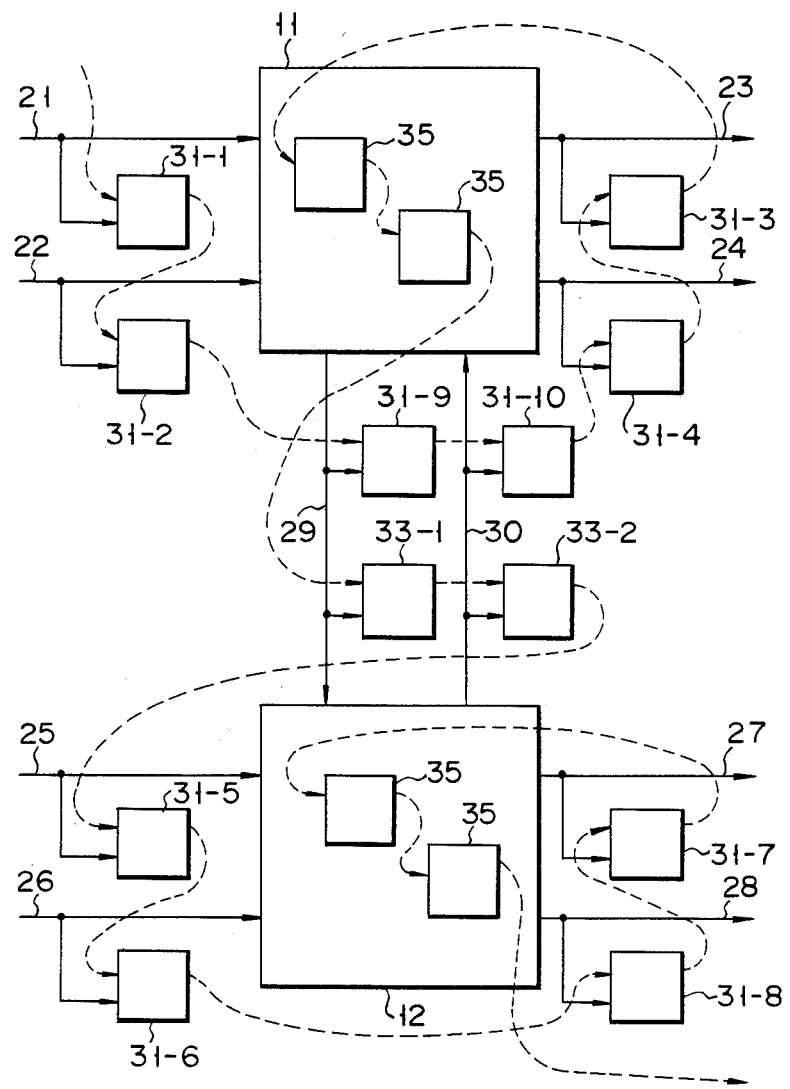
F I G. 6

TRANSFER CIRCUIT FOR OPERATION TEST OF LSI SYSTEMS

BACKGROUND OF THE INVENTION

This invention relates to a transfer circuit used for operation test of LSI systems, and more particularly to a transfer circuit for operation test of LSI systems including general function blocks such as counter circuits, multipliers and arithmetic logic units (ALUs).

In the prior art, a Scan Path technique is known as a method for simplifying the operation test of LSI systems. In the Scan Path technique, D-type flip-flops or sequential circuits are serially connected to form a shift register. In the operation test, the shift register is used to supply plural items of test data to networks connected at the latter stage of the flip-flops and also to latch plural items of system data generated from networks connected at the preceding stage of the flip-flops. The test data items are serially supplied to an input terminal of the shift register and shifted in the shift register to be preset in corresponding flip-flops of the shift register. The latched system data items are shifted in the shift register to be supplied to the exterior from the output terminal and used to be compared with the expected value. In this case, the network of the LSI system is divided into smaller subnetworks and most of the subnetworks each form a combinational network.

FIG. 1 shows the prior art transfer circuit used for the operation test by the Scan Path technique. The transfer circuit is formed on the same semiconductor chip together with LSI system SY, for example. The transfer circuit includes scan registers SR-1 to SR-N which are constituted by flip-flops DF-1 to DF-N and data selectors SL-1 to SL-N in LSI system SY. Each of data selectors SL-1 to SL-N has first and second input terminals and is used to selectively supply one of input signals supplied to the first and second input terminals to D-input terminal of a corresponding one of flip-flops DF-1 to DF-N. Further, the first input terminals of data selectors SL-1 to S1-N are connected to receive system data generated from the subnetworks connected at the preceding stage of flip-flops DF-1 to DF-N, and the second input terminal of data selector of SL-1 is connected to scan input terminal SIN to which test data is supplied and data selectors SL-2 to S1-N are connected to receive output data OUT-1 to OUT-(N-1) from flip-flops DF-1 to DF-(N-1). Scan output terminal SOUT is provided to supply output data OUT-N of flip-flop DF-N to the exterior. The selection operations of data selectors SL-1 to SL-N are controlled by a control signal supplied via terminal CONT and the latch operations of flip-flops DF-1 to DF-N are controlled by a clock signal supplied via terminal CLK. Output data OUT-1 to OUT-N from flip-flops DF-1 to DF-N are further supplied to the latter stage subnetworks.

In order to operate LSI system in a normal fashion apart from the operation test, control signal CONT is set at "0" level and each of data selectors SL-1 to S1-N is so set to select input data supplied to the first input terminal or system data. In this case, flip-flops DF-1 to DF-N are operated to latch the system data at a rising of the clock signal and supply the system data as data output OUT-1 to OUT-N at a falling of the clock signal immediately after the rising thereof.

In the operation test for LSI system SY, control signal CONT is set at "1" level and each of data selectors SL-1 to SL-N is set to select input data supplied to the second input terminal. That is, LSI system SY is electrically isolated from scan registers SR-1 to SR-N. N test data are sequentially supplied to scan input terminal SIN in synchronism with clock signal CLK and latched in respective flip-flops DF-1 to DF-N. Under this condition, control signal CONT is set to "0" level. Then, flip-flops DF-1 to DF-N are operated in one clock cycle under a control of clock signal CLK. In this operation, flip-flops DF-1 to DF-N supply test data to the latter stage subnetworks and then latch system data generated from the preceding stage subnetworks. After this, control signal CONT is set to "1" level again and flip-flops DF-1 to DF-N are operated to sequentially supply system data to the exterior under the control of control signal CLK. Each system data is monitored and compared with the expected value. In the operation test, a combination of test data preset in flip-flops DF-1 to DF-N is repeatedly changed and the same comparison as described above is effected.

In general, the LSI system is designed by a plurality of circuit designers. Each circuit designer designs one of function blocks required to constitute the LSI system, for example, and confirms that the input and output characteristics of the function block satisfy the desired specification. At this time, a test sequence is formed to sequentially change the combination of test data and supply the test data to input terminals of the function blocks. Also, the expected value or a value which is to be generated from the output terminal of the function block according to the sequence is obtained by using a logic simulator. In a case where the Scan Path technique is used for the operation test of the LSI system, the LSI system is divided into subnetworks which are determined by the arrangement of D-type flip-flops DF-1 to DF-N. Since there is no special relation between the subnetworks and the function blocks, the test sequence and the expected value prepared by the circuit designer for attaining the above purpose cannot be used for the operation test of the entire LSI system.

In the case where a designer is required to divide a corresponding function block into subnetworks and prepare a test sequence and expected value therefor, each designer must take the other function blocks into consideration. In this case, it is particularly troublesome to obtain the expected value. For this reason, the expected value obtained cannot be used for the operation test of the entire LSI system until it is carefully checked.

Further, in the Scan Path technique, since it is necessary to entirely scan the LSI system, the number of circuit elements is increased, making it necessary to take an extremely long time for preparing the test sequence.

SUMMARY OF THE INVENTION

An object of this invention is to provide a transfer circuit for the operation test of LSI systems which can improve the testability.

This object can be attained by a transfer circuit for the operation test of an LSI system comprising a mode setting section for selectively setting a first or second operation mode; a plurality of first shift register circuits connected to the preceding stages of function blocks of the LSI system to respectively latch input data to the function blocks in a parallel fashion in the first operation mode and shift the input data in the second operation mode; a plurality of second shift register circuits connected to the latter stages of the function blocks of the LSI system to respectively latch output data of the function blocks in a parallel fashion in the first operation mode and shift the output data in the second operation mode; and a serial transfer line for connecting the first and second shift register circuits in a serial fashion.

In the transfer circuit, when the mode setting section sets the first operation mode and then sets the second operation mode, the first and second shift register circuits are operated to respectively latch and shift the input and output data. Therefore, input and output data of the function blocks are serially transferred via the serial transfer line and the input and output data can be monitored at the outside. Thus, the expected value prepared for the operation test of a single function block by each designer can be used for operation tests of the entire LSI system, making it possible to reduce the time for preparation for the expected value.

BRIEF DESCRIPTION OF THE DRAWINGS

FIG. 2 shows the construction of a transfer circuit according to a first embodiment of this invention and used for the operation test of LSI systems;

FIG. 5 shows a transfer circuit according to a second embodiment of this invention in which a scan register is not commonly used for function blocks; and FIG. 6 is a diagram schematically showing a transfer circuit according to a third embodiment of this invention which is similar to that of the second embodiment except that a scan register is used in the function block shown in FIG. 5.

DETAILED DESCRIPTION OF THE PREFERRED EMBODIMENTS

Figure 1:
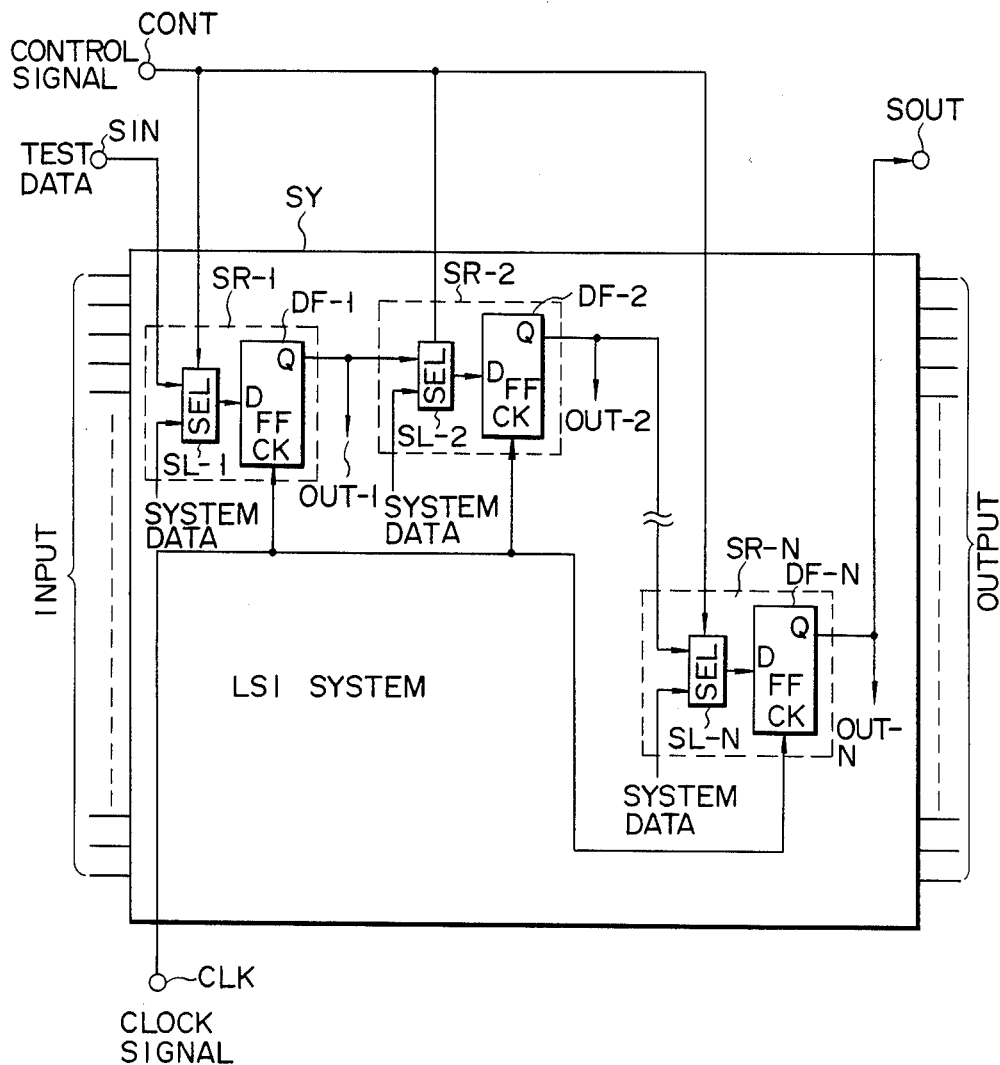
FIG. 1 shows the prior art transfer circuit used for the operation test of LSI system by the Scan Path technique.

There will now be described a transfer circuit according to one embodiment of this invention with reference to FIGS. 2 to 4.

FIG. 2 is a block diagram showing the construction of the transfer circuit. The transfer circuit may be formed together with an LSI system in a single semiconductor chip in the same manner as in the prior art. The LSI system includes general function blocks 11 and 12 which may independently function as counter circuits, multipliers and arithmetic logic units.

Further, the LSI system includes one-bit signal lines 21 and 22 used for supplying data signals IN1 and IN2 from the exterior to function block 11 and one-bit signal lines 23 and 24 used for transferring data signals OUT1 and OUT2 from function block 11 to the exterior. The LSI system also includes one-bit signal lines 25 and 26 used for supplying data signals IN1 and IN2 from the exterior to function block 12 and one-bit signal lines 27 and 28 used for transferring data signals OUT1 and OUT2 from function block 12 to the exterior. Further, the LSI system includes one-bit signal lines 29 and 30 connected between function blocks 11 and 12. Signal line 29 is used to supply a data signal from function block 11 to function block 12 and signal line 30 is used to supply a data signal from function block 12 to function block 11.

The transfer circuit includes ten scan registers 31-1 to 31-10 provided for respective signal lines. Each of scan registers 31-1 to 31-10 is constituted by selector SL1 and D-type flip-flop DF connected to each other in the same manner as in the prior art scan register. However, circuit elements of scan registers 31-1 to 31-10 are provided independently from circuit elements of the function blocks of the LSI system of function blocks 11 and 12 so that the operation test of function blocks 11 and 12 can be effected. A first input terminal of the data selector of scan register 31-1 is connected to scan input terminal SIN and a second input terminal thereof is connected to signal line 21. First input terminals of data selectors SL1 of scan registers 31-2, 31-9, 31-10, 31-4, 31-3, 31-5, 31-6, 31-8 and 31-7 are respectively connected to output terminals of flip-flops DF of scan registers 31-1, 31-2, 31-9, 31-10, 31-4, 31-3, 31-5, 31-6, and 31-8, and second input terminals thereof are respectively connected to signal lines 22, 29, 30, 24, 23, 25, 26, 28 and 27. A control signal is supplied data selectors SL1 of scan registers 31-1 to 31-10 via terminal CONT, and a clock signal is supplied to flip-flops DF of scan registers 31-1 to 31-10 via terminal CLK. Scan registers 31-1, 31-2 and 31-9 are combined to constitute a shift register for latching input data to function block 11 in parallel, and scan registers 31-10, 31-4 and 31-3 are combined to constitute a shift register for latching output data from function block 11 in parallel. Likewise, scan registers 31-5, 31-6 and 31-9 are combined to constitute a shift register for latching input data to function block 12 in parallel, and scan registers 31-7, 31-8 and 31-10 are combined to constitute a shift register for latching output data from functon block 12 in parallel. Each of data selectors SL1 of scan registers 31-1 to 31-10 function to selectively supply one of data signals supplied to the first and second input terminals to D-input terminal of a corresponding flip-flop DF under the control of control signal CONT. Each of flip-flops DF of scan registers 31-1 to 31-10 latches an input data signal in response to a rising of clock signal CLK, and outputs the data signal in response to a falling of clock signal CLK. An output signal of scan register 31-10 is supplied to scan output terminal SOUT as an output signal of the transfer circuit.

In order to operate the LSI system in an ordinary manner, the control signal is set to "0" level. At this time, each of the data selectors of scan registers 31-1 to 31-10 selects a data signal supplied from a corresponding one of signal lines 21 to 30 to the first input terminal. Function block 11 performs a predetermined operation according to data signals IN1 and IN2 supplied via signal lines 21 and 22 and a data signal supplied via signal line 30, and supplies data signals OUT1 and OUT2 via signal lines 23 and 24. Likewise, function block 12 performs a predetermined operation according to data signals IN3 and IN4 supplied via signal lines 25 and 26 and a data signal supplied via signal line 29, and supplies data signals OUT3 and OUT4 via signal lines 27 and 28.

In contrast, in the test operation, control signal CONT is set at "1" level. When control signal CONT is at "1" level, each of data selectors SL1 of scan registers 31-1 to 31-10 selects an input data signal supplied to the first input terminal. Under this condition, each of flip-flops DF of scan registers 31-1 to 31-10 performs one clock cycle operation in response to clock signal CLK. That is, each flip-flop DF latches a data signal supplied thereto from a corresponding one of data selectors SL1 in response to the rising of clock signal CLK and outputs the data signal in response to the succeeding falling of the clock signal.

After this, each flip-flop DF performs the shift operation in response to clock signal CLK to serially transfer the contents therein via the scan registers at the latter stage and the signal lines therebetween and supplies the same from scan output terminal SOUT to the exterior. The operation test is effected by comparing the output data thus obtained and the predetermined expected value.

Various examples of test sequences for the LSI system can be made. However, in the case where a plurality of function blocks are associated to constitute the LSI system as in this embodiment and the function blocks have the particular construction which is previously known as a multiplier, for example, the test sequence of the LSI system can be easily formed. In contrast, in the prior art method, since the LSI system is not divided into respective function blocks, sequence circuits such as registers are not always provided in the input and output sides of the multiplier. Therefore, it is necessary to take the operation of the multiplier and the logic circuits associated therewith into consideration in order to form the test sequence, thus making it impossible to easily form the test sequence as in the embodiment described above.

In the logic circuit of the above embodiment, since the circuit is divided into respective function blocks, the relation between the expected value and the test data contained in the test sequence prepared for the operation test of each function block can be utilized for forming the test sequence for the operation test of the entire LSI system. Further, since the scale of each function block is smaller than that of the entire LSI system, the time for the operation test can be reduced in comparison with the case where the operation test is effected using test data for testing the entire LSI system at one time. In general, the test time can be expressed by $T/n^2$, where n is the number of sections divided in the LSI system and T is the time for testing the entire LSI system at one time. In this embodiment, n is 2, and therefore the test time can be reduced to ¼ times that of the prior art case.

Figure 3:
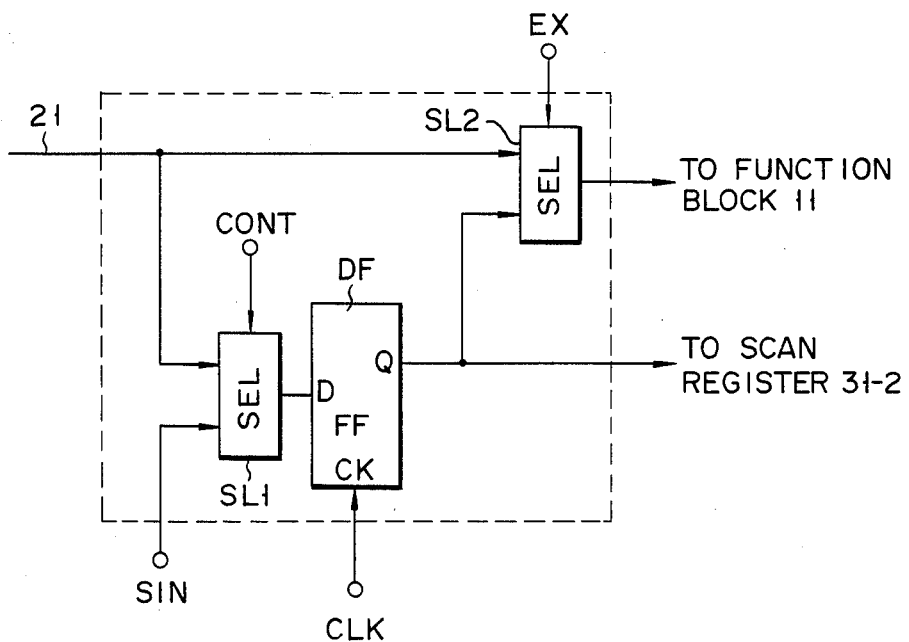
FIG. 3 is a modification of a scan register in the first embodiment formed to supply test data to a function block shown in FIG. 2.
Figure 4:
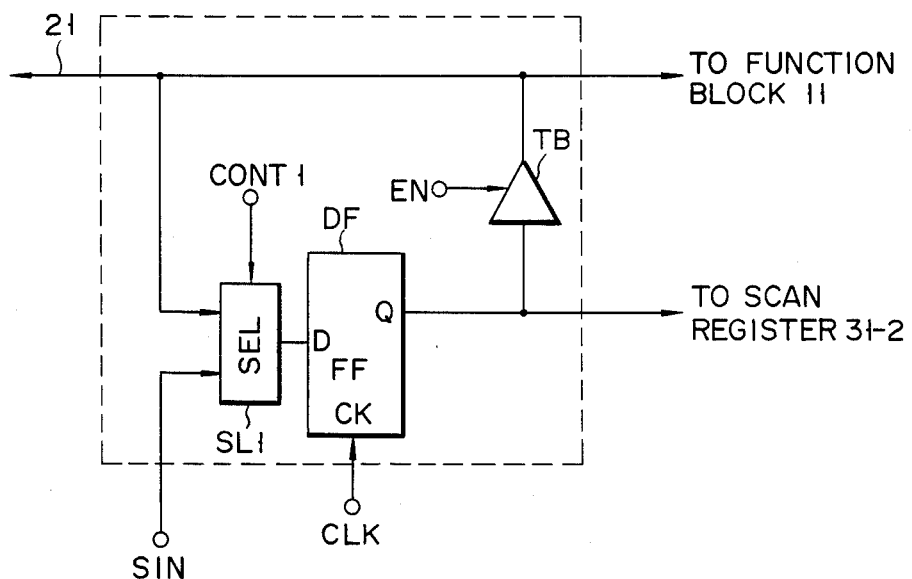
FIG. 4 is a modification of the scan register in the first embodiment used for supplying test data to the function block via a bi-directional signal line.

FIGS. 3 and 4 are modifications of the scan register used in the first embodiment. Assume now that the scan register shown in FIG. 3 or 4 is used instead of each of scan registers 31-1, 31-2, 31-9, 31-10, 31-5 and 31-6 as shown in FIG. 2. In this case, test data are serially supplied via scan input terminal SIN to be preset in the scan registers, and then test data supplied in parallel from the scan registers to the first and second function blocks 11 and 12. In FIGS. 3 and 4, a connection between the scan register and the external stage thereof is made with reference to the case of scan register 31-1. Therefore, it is necessary to determine connections between the other scan registers and their external stages with reference to those shown in FIG. 2.

The scan register of FIG. 3 includes data selector SL2 connected to the output terminal of D-type flip-flop DF of FIG. 2. Data selector SL2 has first and second input terminals connected to signal line 21 and the output terminal of flip-flop DF and selectively produces one of two input signals according to selection signal EX. In order to supply the test data to function block 11 via signal line 21, the test data is first preset in flip-flop DF and then selection signal EX is set to "1" level. In the case of normal operation of the LSI system, that is, in the case where test data is not supplied to function block 11, selection signal EX is set at "0" level. The modification is used in the case where signal input line 21 is of the type for transferring a data signal in one direction.

In contrast, the scan register of FIG. 4 is used in the case where signal line 21 is of the bi-directional type. The scan register has tri-state buffer circuit TB provided at the latter stage of D-type flip-flop DF. Tri-state buffer circuit TB is connected between flip-flop DF and signal line 21 as shown in FIG. 4, and connected to receive enable signal EN. In order to supply test data to signal line 32, the test data is first preset in flip-flop DF and then enable signal EN is set to "1" level. As a result, tri-state buffer circuit TB sets signal line 21 to a potential corresponding to the test data, thus supplying the test data to function block 11. In contrast, in the normal operation of the LSI system, enable signal EN is set at "0" level. At this time, the output state of tri-state buffer circuit TB is set in the high impedance state and the potential of signal line 21 can be set by an external data signal irrespective of tri-state buffer circuit TB.

The transfer circuit of the first embodiment has scan register 31 or scan registers 31-9 and 31-10 connected to signal lines 29 and 30 connecting function blocks 11 and 12 together. Scan register 31-9 is used to latch an output signal from function block 11 and an input signal to function block 12, and scan register 31-10 is used to latch an output signal from function block 12 and an input signal to function block 11. Thus, since the scan register can be commonly used for the function blocks, the operation test described above can be effected with a smaller number of scan registers. This method can be advantageously utilized when the number of function blocks contained in the LSI system is small. In contrast, when the the LSI system is complicated in construction and a large number of function blocks are used, an error may easily occur at the time of forming test sequences and it becomes necessary to change the test sequence which has been prepared for the operation test of each function block.

FIG. 5 is a block diagram showing the construction of a transfer circuit according to the second embodiment of this invention which includes two function blocks 11 and 12 as in the first embodiment.

In the transfer circuit of the second embodiment, scan registers 33-1 and 33-2 are used to respectively latch input and output signals of function block 12, and scan registers 31-9 and 31-10 are used to respectively latch output and input signals of function block 11. In this case, scan registers 33-1, 33-2, 31-5, 31-6, 31-8 and 31-7 are combined to constitute a first scan path for the operation test of function block 12, and scan registers 31-1, 31-2, 31-9, 31-10, 31-4 and 31-3 are combined to constitute a second scan path for the operation test of function block 11. The first and second scan paths are serially connected.

In this embodiment, the problem in the first embodiment can be effectively solved, and input and output signals of function block 11 and input and output signals of function block 12 can be easily separated from each other. Further, in the case where the scan register shown in FIG. 3 or 4 is used instead of scan registers 31-1, 31-2, 31-10, 31-3, 31-5 and 31-6 of this embodiment to latch the test data, output data of function block 11 can be latched by scan register 31-9 and at the same time test data can be input to function block 11 by means of scan register 33-1. Similarly, output data of function block 12 can be latched by scan register 33-2 and at the same time test data can be input to function block 11 by means of scan register 31-10. That is, this method can be advantageously used in the case where the LSI system has a large number of function blocks and test data is input to each of the function blocks. In this case, the expected value and the test sequence prepared for the operation test of each function block can be used for the operation test of the LSI system without any modification.

This invention has been described with reference to the embodiments, but it is not limited to these embodiments and various modification can be made without departing from the scope of this invention. For example, in the case where each of function blocks 11 and 12 is constituted to include flip-flops, registers and the like as schematically shown in FIG. 6, the internal sequence circuit can be replaced by scan registers 35 which are connected in the test operation to constitute a shift register together with scan registers 31-1 to 31-10, 33-1 and 33-2 provided outside the function block as shown by the broken line in FIG. 6. In this way, the scan registers 35 can be connected to scan registers 31 for input and output signals of the function block at the time of test operation, thus permitting the test operation to be easily effected.

What is claimed is:

1. A transfer circuit for the operation test of an LSI system comprising:
   mode setting means for selectively setting a first or second operation mode;
   a plurality of first shift register means connected to function blocks of said LSI system and each including a plurality of scan registers which are connected to input terminals of a corresponding one of the function blocks to respectively latch input data of the corresponding function block in the first operation mode and which are serially connected to shift the contents in the second operation mode;
   a plurality of second shift register means connected to the function blocks of said LSI system and each including a plurality of scan registers which are connected to output terminals of a corresponding one of the function blocks to respectively latch output data of the corresponding function block in the first operation mode and which are serially connected to shift the contents in the second operation mode; and
   serial transfer means for serially connecting said first and second shift register means to constitute a shift register circuit.

2. A transfer circuit according to claim 1, wherein said serial transfer means includes a scan input terminal through which plural items of test data are serially supplied to be preset in the scan registers of said first shift register means in said second operation mode, and the scan registers of said first register means each include test input means for exclusively supplying the preset test data item to a corresponding one of input terminals of said function blocks.

3. A transfer circuit according to claim 2, wherein said input means has a data selector connected to receive input and test data for said function block, for selecting one of received input data and received test data to supply the selected data to said function block through an input line thereof.

4. A transfer circuit according to claim 2, wherein said input means has a tri-state buffer connected to receive test data for said function block, for selectively supplying a received test data to said function block through a bi-directional or input/output line thereof.

5. A transfer circuit according to claim 2, wherein said serial transfer means includes a transfer line for combining the first and second shift register means connected to the same function block to serially connect the scan paths which each are constituted by the combined shift register means.

6. A transfer circuit according to claim 1, wherein said serial transfer means includes at least one third shift register means connected in series with said first and second shift register means.

7. A transfer circuit according to claim 6, wherein said third shift register means includes a plurality of scan registers which are connected to junctions between two of said function blocks to respectively latch data transferred therethrough in the first operation mode and which are serially connected to shift the contents in the second operation mode.

8. A transfer circuit according to claim 6, wherein said third shift register means includes a plurality of scan registers which each has a D-type flip-flop serving as a circuit element of one function block, which are connected to receive input data of the D-type flip-flops to respectively latch the input data in the first operation mode, and which are serially connected to shirt the contents in the second operation mode.

9. A transfer circuit for the operation test of an LSI system comprising:
   mode setting means for selectively setting a first or second operation mode;
   a plurality of shift register means connected to function blocks of said LSI system and each including a plurality of scan registers which are connected to input and output terminals of a corresponding one of the function blocks to respectively latch one of input and output data of the corresponding function block in the first operation mode and which are serially connected to shift the contents in the second operation mode; and
   serial transfer means for serially connecting said plurality of shift register means to constitute a shift register circuit.

* * * * *